United States Patent [19]

Gerard

[11] 4,097,825
[45] Jun. 27, 1978

[54] SURFACE ACOUSTIC WAVE TAPPED DELAY LINE

[75] Inventor: Henry M. Gerard, Capistrano Beach, Calif.

[73] Assignee: Hughes Aircraft Company, Culver City, Calif.

[21] Appl. No.: 757,128

[22] Filed: Jan. 5, 1977

[51] Int. Cl.$^2$ .................. H03H 9/30; H03H 9/26; H03H 9/32; H03H 9/02

[52] U.S. Cl. .................. 333/30 R; 310/313; 333/70 T; 333/72

[58] Field of Search ............... 333/30 R, 72, 71, 70 T; 330/5.5; 310/313; 331/107 A; 358/201; 340/173.2

[56] References Cited

U.S. PATENT DOCUMENTS 3,983,517  9/1976  Weglein .................. 333/72

OTHER PUBLICATIONS

Holland et al. — "Practical Surface Acoustic Wave Devices" in Proceedings of IEEE, vol. 62, No. 5, May 1974; pp. 582–611.

*Primary Examiner*—Alfred E. Smith
*Assistant Examiner*—Marvin Nussbaum
*Attorney, Agent, or Firm*—John Holtrichter, Jr.; W. H. MacAllister

[57] ABSTRACT

A surface acoustic wave device having spaced tapping output transducers disposed in the path of surface acoustic wave energy propagating along a planar substrate surface from an input transducer. The device including an ion-etched groove array disposed in the planar surface between the tapping transducers to reduce acoustic wave reflections at desired frequencies within a desired passband and suppress spurious signal-producing surface acoustic wave reflections.

5 Claims, 3 Drawing Figures

SURFACE ACOUSTIC WAVE TAPPED DELAY LINE

BACKGROUND OF THE INVENTION

The background of the invention will be set forth in two parts.

1. Field of the Invention

This invention relates to acoustic surface wave devices and more particularly to tapped delay lines.

2. Description of the Prior Art

In the past, tapped delay lines using surface acoustic wave techniques experienced serious reflection problems, that is, surface acoustic wave energy was reflected by each tapping output transducer back along the main beam path to the input transducer, where it is reflected back to the tapping transducers. This reflected energy is seen as spurious double and triple transit echo signals.

One standard technique to reduce the undesired echo signals is to use double electrodes in the transducers. This is only a partial solution because the echo signals produced by coupling between adjacent transducers cannot be eliminated by the double electrode technique.

A double electrode transducer is an interdigital array having two electrodes per one-half acoustic wave length. It does reduce some of the undesirable reflections but requires increased resolution in the lithographic process used to fabricate the arrays.

Another prior art technique employed to alleviate the problem of spurious signal generation due to output tap reflections is to use what is normally called an intertap "jailbar" grating. This is an array of metal strips disposed in the path of the propagating surface acoustic wave energy between adjacent pairs of output tapping transducers to break up the coarse periodicity of the output taps, which would otherwise cause strong acoustic wave reflections at certain frequencies within the device passband. The difficulty with the metal grating approach is that surface acoustic energy propagation loss is increased drastically at moderate to high frequencies (>60 MHz). Another disadvantage of using "jailbar" gratings is that the intertap delay through the metal "jailbars" may vary appreciably with the quality of the tapped delay line photolithography. It can, therefore, be seen that a technique which reduces undesirable tapping transducer reflections while not significantly increasing propagation loss, and which is virtually insensitive to photolithography quality, would consistitute a significant advancement of the art.

SUMMARY OF THE INVENTION

In view of the foregoing factors and conditions characteristic of the prior art, it is a primary object of the present invention to provide an improved surface acoustic wave tapped delay line.

Another object of the present invention is to provide a tapped delay line having a reduced spurious transit echo characteristic and which does not include structure tending to significantly increase propagation loss.

Still another object of the present invention is to provide a surface acoustic wave tapped delay line which is not sensitive to the quality of the photolithographic process used to produce the reflection-reducing structure.

In accordance with the present invention, a surface acoustic wave tapped delay line includes input means having an input transducer disposed on the surface of a substrate of material capable of supporting propagating surface acoustic wave energy, the input transducer being able to launch surface acoustic wave energy along a propagation path in response to an electrical signal. The invention also utilizes tapping means including at least two spaced double-electrode tapping transducers disposed on the substrate surface in the propagation path, where each such transducer extracts a selected predetermined portion of the propagating surface acoustic wave energy. Further, the invention includes suppression means, including a grooved element array disposed in the substrate surface between the tapping transducers for reducing acoustic wave reflections at desired frequencies within a desired passband and suppressing spurious signals produced thereby.

The grooves are spaced one-quarter acoustic wavelength apart (center-to-center) to cancel reflections from individual ones of the grooves, and may be ion-etched.

The features of the present invention which are believed to be novel are set forth, with particularity, in the appended claims. The present invention, both as to its organization and manner of operation, together with further objects and advantages thereof, may best be understood by making reference to the following description, taken in conjunction with the accompanying drawing, in which like reference characters refer to like elements in the several views.

DESCRIPTION OF THE PREFERRED EMBODIMENT

Figure 1:
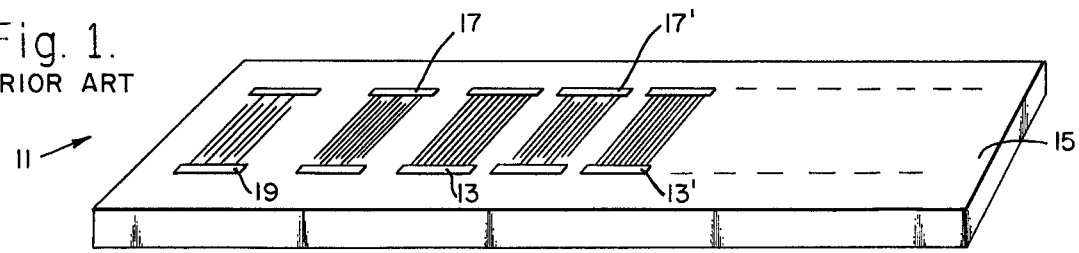
FIG. 1 is a schematically represented perspective view of a surface acoustic wave tapped delay line using "jailbar" gratings as has been the practice in the prior art.

Referring now to the drawing and more particularly to FIG. 1, there is shown a surface acoustic wave tapped delay line 11 incorporating what are commonly known as "jailbar" gratings 13 disposed on a substrate surface 15 between adjacent conventional tapping structures 17, all such structures being in the path of propagating surface acoustic wave energy generated by a conventional input electroacoustic transducer 19.

As indicated previously, the intertap "jailbar" gratings are designed to break up the coarse periodicity of the output taps, which otherwise cause strong surface acoustic wave reflections at certain frequencies within the device passband, however, with the disadvantage of drastically increasing surface acoustic wave propagation loss at moderate to high frequencies. The "jailbar" structures are rather well known and their theory of operation and other design information may be obtained by making reference to several papers that have been published on the subject, including, for example, a paper by G. W. Judd, W. R. Jones and T. W. Bristol in the 1972 IEEE Ultrasonic Symposium Proceedings, No. 72 C 80708-8 SU, pages 373–376, 1972, entitled "An Improved Tapping Transducer Geometry for Surface Wave Phase Coded Delay Lines".

Figure 2:
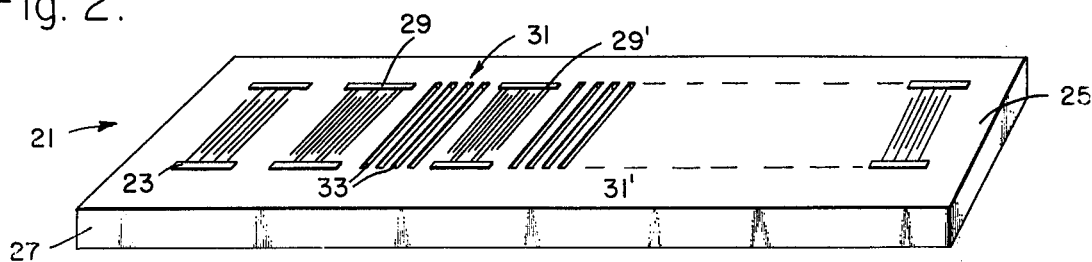
FIG. 2 is a schematically represented perspective view of a surface acoustic wave tapped delay line constructed in accordance with the invention.
Figure 3:
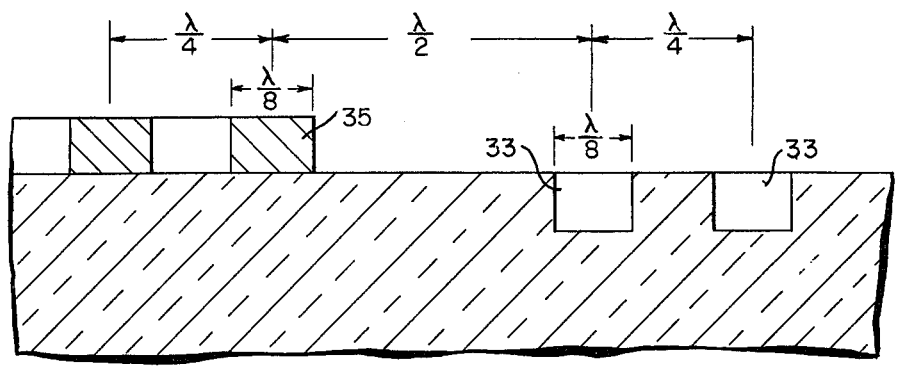
FIG. 3 is a side elevational view of a portion of the device shown in FIG. 2, in accordance with one embodiment of the invention.

Referring now to FIGS. 2 and 3, there is shown a new and improved surface acoustic wave tapped delay line 21 which eliminates spurious signals without substantially increasing propagation loss. The device 21 includes a conventional input electroacoustic transducer 23 disposed on a planar surface 25 of a material 27 capable of supporting propagating surface acoustic wave energy. Also, disposed on the substrate surface 25, and in the path of such propagating energy, are a desired number of spaced, conventional tapping structures 29. Located between these taps, in place of the prior art "jailbar" gratings, are arrays 31 of grooves 33 which arrays also function to suppress spurious signals caused by relatively strong surface acoustic wave reflections at the tapping structures. Not only are undesired spurious signals suppressed, but the grooved intertap arrays are virtually insensitive to the quality of the photolithography procedures used to create them.

The grooves 33 may be provided by conventional ion etching techniques, for example, and for LiNbo₃ substrates, typically have a depth of about 2½% of the acoustic wavelength, where the height of the metal electrodes of the tapping transducers is approximately 400 A. In general, groove depth is proportional to the strength of piezoelectric coupling of the substrate material. In order to provide the desired effect in configurations utilizing double electrode interdigital tapping arrays, the center-to-center spacing between adjacent one-eighth wavelength wide grooves in the arrays 31 should be one-quarter acoustic wavelength, and the center-to-center spacing between the outermost grooves of each grooved array 31 and the outermost conductive one-eighth wavelength wide strip or element of an adjacent double electrode interdigital tapping array should be one-half wavelength, as illustrated in FIG. 3. Alternatively, the latter spacing may be a number of one-half wavelengths long. In the case of LiNbO₃, for example, where the height of the metalized tapping electrodes or strips is significantly greater than that previously mentioned, the depth of each groove should be increased to about 3% of the acoustic wavelength, or even more.

It should be evident from the foregoing that a novel and advantageous broadband surface acoustic wave tapped delay line has been described which makes it possible to obtain a high degree of spurious signal reduction which suffering relatively low propagation loss, and which design is virtually insensitive to the quality of the photolithograph technique utilized in its production.

Furthermore, it should be understood that although certain materials and processes have been mentioned, other materials and processes providing similar qualities and structures may be substituted for those described. The various devices and techniques recited herein are examples of practicing the invention and other embodiments following these novel teachings are deemed to lie within the spirit, scope and contemplation of the invention.

What is claimed is:

1. A surface acoustic wave tapped delay line, comprising:
    a. a substrate of material having a planar surface capable of supporting propagating surface acoustic wave energy;
    b. input means including an input transducer disposed on said substrate surface for launching surface acoustic wave energy along a propagation path in response to an electrical input signal;
    c. tapping means, including at least two spaced double electrode tapping transducers, disposed on said surface in said propagation path each for extracting a selected portion of said propagating surface acoustic wave energy; and
    d. suppression means, including a grooved element array disposed in said surface between said tapping transducers, for reducing acoustic wave reflections at desired frequencies within a desired passband and suppressing spurious signals produced thereby.

2. The surface wave tapped delay line according to clam 1, wherein said grooves are spaced one-quarter acoustic wavelength apart to cancel reflections from individual ones of said grooves.

3. The surface acoustic wave delay line according to claim 1, wherein said grooves are one-eighth acoustic wavelength wide and the spacing between outermost ones of said grooves and adjacent outermost ones of the electrodes of said tapping transducers is one-half acoustic wavelength.

4. The surface acoustic wave delay line according to claim 1, wherein the depth of said grooves below said substrate surface is approximately 2½% of said acoustic wavelength.

5. The surface acoustic wave tapped delay line according to claim 1, wherein said grooves are ion-etched.

* * * * *